(12) United States Patent
Park et al.

(10) Patent No.: US 6,177,335 B1
(45) Date of Patent: Jan. 23, 2001

(54) METHOD OF FORMING POLYCIDE

(75) Inventors: Ji-Soo Park; Dong-Kyun Sohn, both of Cheongju (KR)

(73) Assignee: Hyundai Electronics Industries Co., Ltd., Kyoungki-do (KR)

(*) Notice: Under 35 U.S.C. 154(b), the term of this patent shall be extended for 0 days.

(21) Appl. No.: 09/522,069

(22) Filed: Mar. 9, 2000

(30) Foreign Application Priority Data

Mar. 10, 1999 (KR) .................................................. 99-7880

(51) Int. Cl.[7] ...................................................... H01L 21/20
(52) U.S. Cl. .............................................. 438/584; 438/592
(58) Field of Search ...................................... 438/580–584, 438/592, 630, 648, 651, 767, 768, 783, 785

(56) References Cited

U.S. PATENT DOCUMENTS 5,712,181 * 1/1998 Byun et al. ............................. 437/46

OTHER PUBLICATIONS

P. Werner et al., Mat. Res. Soc. Symp. Proc. vol. 320 pp. 227–232.

* cited by examiner

*Primary Examiner*—David Nelms
*Assistant Examiner*—Quoc Hoang

(57) ABSTRACT

The method of forming a polycide that includes the steps of forming an insulating layer on a substrate, forming a first semiconductor layer on the insulating layer and forming a metal-ion buried layer in the first semiconductor layer; wherein the metal-ion buried layer is formed to be located to a predetermined depth from an upper surface of the first semiconductor layer. An impurity-ion buried layer is formed under the metal-ion buried layer in the first semiconductor layer such that the impurity-ion buried layer makes the first conductive layer electrically-conductive. A silicide layer and a conductive second semiconductor layer are formed by carrying out thermal treatment on the metal-ion buried layer and the impurity-ion buried layer.

26 Claims, 5 Drawing Sheets

METHOD OF FORMING POLYCIDE

BACKGROUND OF THE INVENTION

1. Field of the Invention

The present invention relates to a method of forming polycide. More particularly, the present invention relates to a method of forming polycide in a semiconductor device.

2. Discussion of Related Art

As a semiconductor device requires higher density of integration, the impurity region and gate width are reduced in size. Unfortunately, operation speed of the semiconductor device is decreased due to both the increased contact resistance of the impurity region and the increased sheet resistance of the gate.

To counteract these effects, the resistance is reduced by forming wires in a semiconductor device from a low resistance substance such as an Al alloy, W and the like and/or by forming a silicide layer on a polysilicon layer on the gate electrode. When the silicide layer is formed on the gate of polysilicon, sheet resistance is also reduced by forming a silicide layer on the surface of the impurity region.

As mentioned in the above description, the major factor lowering the operation speed of a semiconductor device is the high resistance at the gate due to the strict design rules of the semiconductor device. Therefore, it is essential to fabricate a gate electrode of low resistance to improve the operation speed of the device. For this purpose, the gate electrode has a refractory metal silicide of low specific resistance positioned thereon. A gate electrode having such a configuration is called a polycide(silicide on doped polycrystalline silicon) type gate electrode. $WSi_2$ prevails in forming the polycide structure. Yet, the formation of a silicide with a resistance lower than that of $WSi_2$ is required as the area occupied by a unit device decreases due to the high density of a device. In this case, the specific resistance of $WSi_2$ ranges from 60 to 200 $\mu$-cm. $CoSi_2$ and $TiSi_2$, where the specific resistance ranges from 15 to 20 $\mu$-cm , are the most promising substitute materials.

Various methods of forming a polycide are represented by the two following procedures.

In the first procedure a silicide is formed by depositing a metal layer on a doped polysilicon layer and by reacting the metal with the silicon through thermal treatment. Unfortunately, the silicide of metal-Si lacks uniformity and sufficient thickness.

Generally, a pure metal reacts vigorously with silicon, making the interface between the Si and the silicide rough such that it becomes difficult to pattern a gate electrode. This is explained in detail in J.S. Byun et al., J. Electrochem. Soc., vol. 144,3175 (19997). Moreover, it is difficult to form a uniform silicide due to the high density of dopants as the metal reacts with the heavily-doped polysilicon.

In the second procedure, a silicide is directly deposited on a doped polysilicon layer instead of using the above-described thermal process. Generally, a silicide layer is formed on a doped polysilicon layer by sputtering from a silicide composite target. However, this method generates particles on the forming silicide. Also, it is difficult to form a silicide of uniform composition due to the different sputtering ratios of respective components in the metal/silicon composite target hence particles are generated.

Additionally, when a high performance dual gate CMOS device is fabricated by the above two methods, it is difficult to carry out a doping process for a PMOS device where boron is used as a dopant. This is because boron has a very high diffusivity and can diffuse into a polysilicon layer of relatively low thickness, into a gate insulating layer, and a silicon substrate. Thus, the reliance of a device is decreased.

FIG. 1A to FIG. 1C show cross-sectional views of a method for forming polycide in a semiconductor device according to the related art. Referring to FIG. 1A, an active region and a device-insulation region are defined by forming a field oxide layer in a predetermined portion of the silicon substrate 10 by LOCOS(Local Oxidation of Silicon) or the like. A gate oxide layer 11, as a gate insulating layer, is formed by thermal oxidation on a surface of the silicon substrate 10.

A doped polysilicon layer 120, doped with impurities(in-situ doped polycrystalline silicon) to form a gate electrode, is deposited on the gate oxide layer 11 by chemical vapor deposition(hereinafter abbreviated CVD). Alternately, an undoped polysilicon layer 120, having been deposited by CVD, is doped by ion-implantation. The lower structure of the gate electrode is formed by patterning the polysilicon layer 120. In this case, considering the total height of a gate electrode, the polysilicon layer 120 is formed to the thickness which does not include the thickness of a silicide layer to be formed. Therefore, the thickness of the polysilicon layer 120 is reduced by the thickness of the suicide layer. When a dual gate CMOS device is fabricated, the doping step for a PMOS device becomes very difficult when boron is used as the dopant. This is because boron has a very high diffusivity and diffuses into a polysilicon layer of low relative thickness and diffuses into the gate insulating layer and silicon substrate.

Referring to FIG. 1B, a metal layer is formed by depositing Co or Ti as a metal for forming a silicide on the polysilicon layer 120 by sputtering. In this case, to be proper for the design rule of a gate electrode, the thickness of the metal layer depends on the total thickness which includes the thickness of the polysilicon layer 120. A silicide layer 130 is formed by reacting metal with silicon by carrying out a rapid thermal annealing(hereinafter abbreviated RTA) on the polysilicon and metal layers. Instead of forming the silicide layer 130 by RTA, a silicide layer 130 may be formed by depositing silicide directly on the doped polysilicon layer 120 by using a silicide composite target. Referring to FIG. 1C, after the silicide layer 130 has been coated with photoresist, a photoresist pattern(not shown in the drawing) is formed by exposure and development of the photoresist using a mask for defining a gate electrode. A final gate electrode 131 and 121, comprised of a remaining silicide layer 131 and a remaining doped polysilicon layer 121, is formed by removing the silicide layer and the polysilicon layer which are not covered with the photoresist pattern. In this case, the final gate electrode 131 and 121 is formed by carrying out dry etching on the silicide layer and the doped silicon layer using the photoresist pattern as a mask. Then, the photoresist pattern is removed by $O_2$ ashing.

Though not shown in the drawing, semiconductor devices such as a transistors and the like are completed by forming a lightly doped drain(hereinafter abbreviated LDD) region in a predetermined portion of the substrate, by forming a gate sidewall spacer and by forming a source and a drain and the like. Unfortunately, the above method of forming polycide according to the related art by forming silicide from the reaction of metal/silicon by RTA has difficulty in forming a silicide layer having uniformity and sufficient thickness due to the high density of dopants, wherein the metal reacts with the heavily-doped polysilicon. When a silicide is directly deposited onto a doped polysilicon layer instead of using a thermal process, this method of the related art generates particles on the forming silicide. Accordingly, it is difficult to form a silicide of uniform composition due to the different sputtering ratios of respective components in the metal/silicon composite target, which results in the generation of particles. Moreover, when a dual gate CMOS device is fabricated for high performance by the above two methods, it is difficult to carry out a doping process for a PMOS device using boron as a dopant. This is because boron has a very high diffusivity and diffuses into a polysilicon layer of low relative thickness, and diffuses into the gate insulating layer and the silicon substrate. Thus, reliability of the device is decreased.

SUMMARY OF THE INVENTION

Accordingly, the present invention is directed to a method of forming a polycide that substantially obviates one or more of the problems due to limitations and disadvantages of the related art.

Another object of the present invention is to provide a method of forming a polycide in a semiconductor device which improves the morphology of the interface between the silicide and the polysilicon, prevents particles generated from sputtering and provides an easy method of fabricating a PMOS device of a polycide constitution.

These and other objects are achieved by providing a method of forming polycide comprising the steps of forming an insulating layer on a substrate, forming a first semiconductor layer on the insulating layer, forming a metal-ion buried layer in the first semiconductor layer, forming an impurity-ion buried layer under the metal-ion buried layer in the first semiconductor layer; and converting the metal-ion buried layer and the impurity-ion buried layer into a silicide layer and second semiconductor layer, respectively.

Additional features and advantages of the invention will be set forth in the description which follows and in part will be apparent from the description, or may be learned by practice of the invention. Objectives and other advantages of the invention will be realized and attained by the structure particularly pointed out in the written description and claims hereof as well in the appended drawings. It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this application, illustrate embodiments of the invention and, together with the description, serve to explain principles of the invention. In the drawings.

DETAILED DESCRIPTION OF PREFERRED EMBODIMENTS

Reference will now be made in detail to preferred embodiments of the present invention, examples of which are illustrated in the accompanying drawings.

A gate of a polycide structure is formed by carrying out ion-implantation twice with different species of ions into undoped polysilicon and by forming both silicide and doped polysilicon. Namely, silicide and doped polysilicon are attained by forming a gate oxide layer, by depositing an undoped polysilicon of a predetermined thickness proper according to the design rule on the gate oxide layer, by carrying out metal ion-implantation for the silicide and impurity ion-implantation for doping the undoped polysilicon layer separately and by carrying out thermal treatment on the ion-implanted polysilicon layer.

Figure 1A:
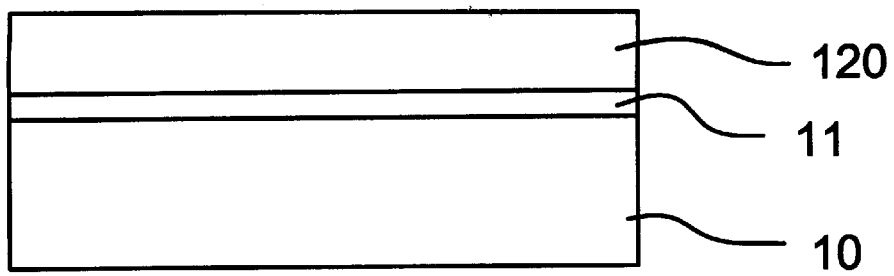
FIGS. 1A to 1C show cross-sectional views of a method of forming polycide in a semiconductor device according to the related art.
Figure 1B:
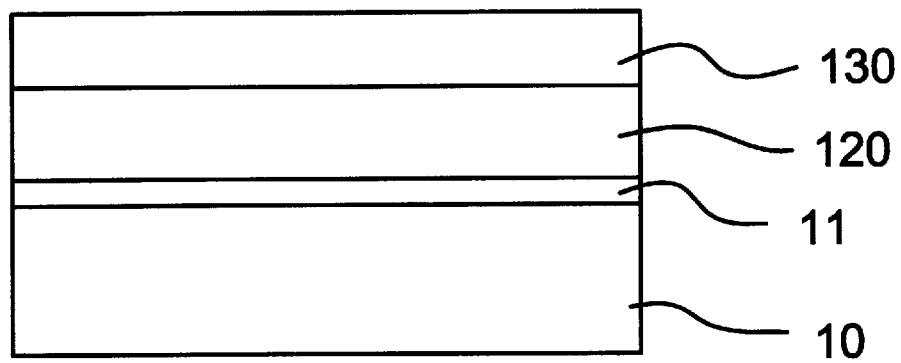
Figure 1C:
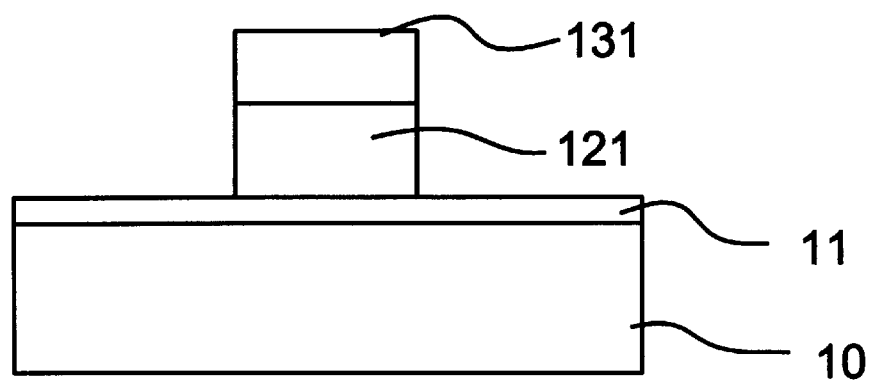
Figure 2A:
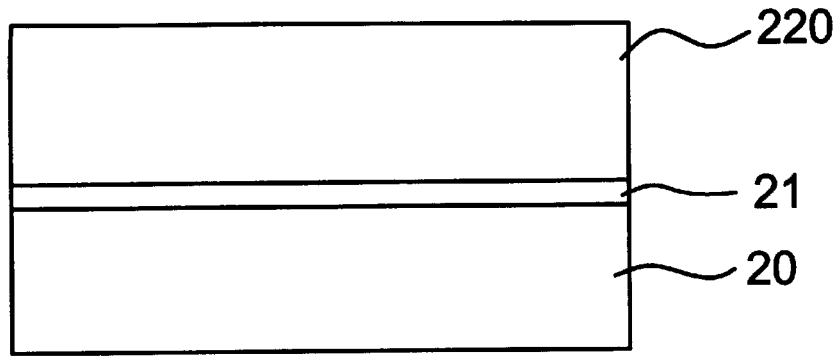
FIGS. 2A to 2E show cross-sectional views of a method of forming polycide in a semiconductor device according to a first embodiment of the present invention.

FIGS. 2A to 2E show cross-sectional views of a method for forming polycide in a semiconductor device according to a first embodiment of the present invention. Referring to FIG. 2A, an active region and a device-insulation region are defined by forming a field oxide layer in a predetermined portion of a silicon substrate 20 by LOCOS(Local Oxidation of Silicon) or the like. A gate oxide layer 21 as a gate insulating layer is formed by carrying out thermal oxidation on the surface of the silicon substrate 20.

To form a gate electrode, an undoped polysilicon layer 220 is deposited on the gate oxide layer 21 by CVD. In this case, considering the total height of the gate electrode to be formed, the polysilicon layer 220 is formed to the thickness which includes the thickness of a silicide layer to be formed. Namely, when a silicide layer of $CoSi_2$ is to be formed, an undoped polysilicon layer 220, approximately 2000 Å thick, is formed to make a silicide layer approximately 1000 Å thick and a doped polysilicon layer approximately 1000 Å thick.

Figure 2B:
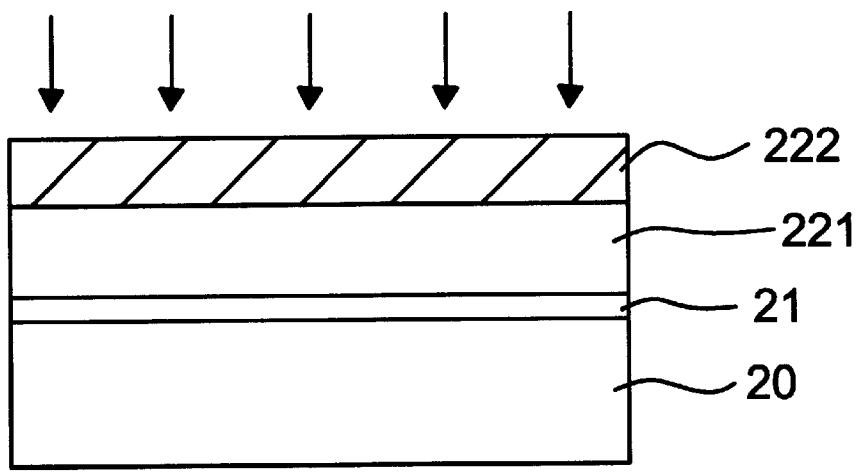

Referring to FIG. 2B, a metal-ion buried layer 222 is formed by carrying out ion-implantation on the undoped polysilicon layer with metal ions for the silicide. The metal ions in the metal-ion buried layer 222 reacts with silicon atoms in the polysilicon layer 220 during a subsequent thermal treatment. Thus, a silicide is formed at the upper part of the polysilicon layer by adjusting the depth of the buried layer. In this case, when the ion-implantation is carried out with metal ions of Co or Ti, a silicide is formed by reacting 1 volume of Co or Ti with 3.6 or 2.2 volumes of Si, respectively. Accordingly, provided that the desired thickness of the silicide layer is 1000 Å, the depth of the buried layer from the surface of the polysilicon layer is chosen to be about 300 Å by adjusting ion-implantation energy. W, Mo, Ta and Pt ions may also be used to form the buried layer.

When ion-implantation is carried out not with ions of specific electric charges but with metal ions of various electric charges, various depths of a buried layer are attained by a single ion-implantation. Namely, a one time ion-implantation is carried out with $Co^+$, $Co^{2+}$, $Co^{3+}$ and the like, each corresponding depth of the buried layer is different from the others. Instead of carrying out ion-implantation one time, a series of metal-ion buried layers are formed by carrying out multiple ion-implantations by varying ion-implantation energy. For instance, a series of Co buried layers are formed to the depth of about 300 Å from the upper surface of the polysilicon layer by ion-implantation energies of 10, 20 and 30 KeV and doses of 1E17 to 5E17 $ions/cm^2$. W, Mo, Ta and Pt are other ions that may also be used.

After the ion-implantation has been completed, a phase change occurs wherein the polysilicon layer 220 turns into an amorphous silicon layer 221. Thus, grain boundaries, which are paths of ion-diffusion, of the polysilicon layer disappear. Accordingly, when the polysilicon layer is doped with boron ions, boron ions are unable to penetrate into the gate oxide layer and the active region (i.e., the channel region) of the substrate.

Figure 2C:
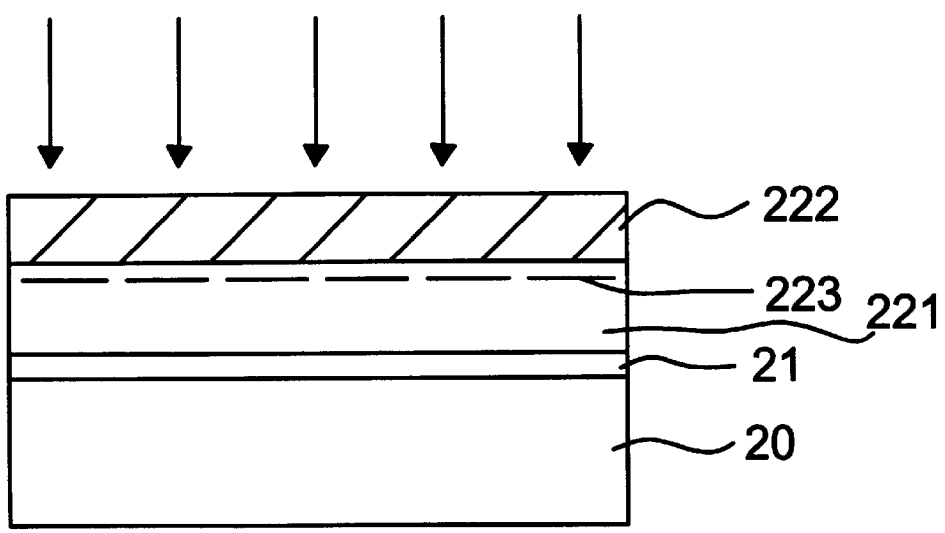

Referring to FIG. 2C, an impurity-ion buried layer 223 is formed inside the amorphous silicon layer 221 by doping the phase-changed amorphous silicon layer 221 with impurity ions to make the layer 221 electrically-conductive. In this case, the ion-implantation energy is found to have the maximum concentration of dopants of impurity ions located at the interface between the metal-ion buried layer 222 and the amorphous silicon layer 221. For instance, ion-implantation energy is about 10 KeV when boron ions are used as dopants.

Moreover, another embodiment of the present invention is achieved by reversing the steps of forming the metal-ion buried layer 222 and the impurity-ion buried layer 223 in FIGS. 2B and 2C. Namely, after ion-implantation with impurities has been carried out to make the polysilicon layer 220 conductive, another ion-implantation with metal ions for forming the silicide is done. The silicon layer is still in a polycrystalline phase after the impurity ion-implantation, but the silicon layer becomes amorphous by a subsequent metal ion-implantation so as to prevent the penetration of boron ions into the gate oxide layer and the channel region of the substrate. In this case, the forming conditions of the buried layers may be the same as given in FIGS. 2B and 2C.

Figure 2D:
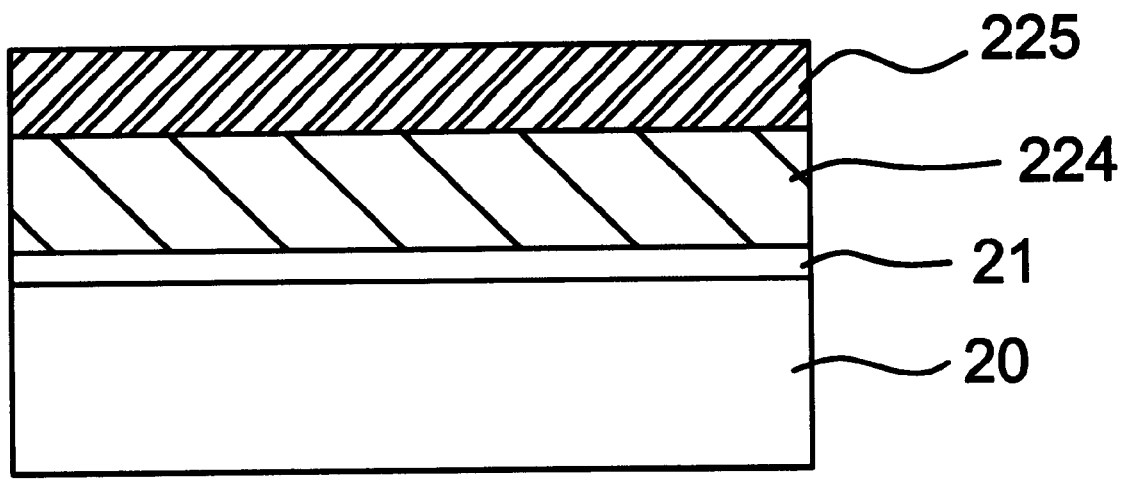

Referring to FIG. 2D, a silicide layer 225 is formed by reacting metal ions in the metal-ion buried layer with silicon in the silicon layer as soon as a conductive silicon layer 224 is formed by diffusing the dopants in the impurity-ion buried layer to make the amorphous silicon layer conductive. The conductive silicon layer 224 becomes a lower part of the gate electrode. The conductive silicon layer 224 may be changed into the polycrystalline structure from the amorphous in accordance with the formation temperature. In this case, the silicide layer 225 and the conductive layer 224 are formed by a thermal treatment at 800 to 900° C. for about 30 seconds.

Figure 2E:
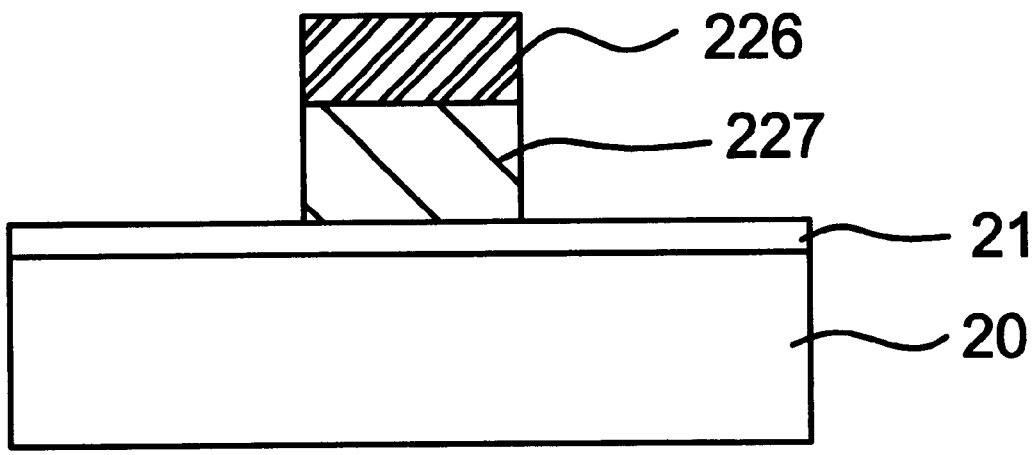

Referring to FIG. 2E, after the silicide layer has been coated with photoresist, a photoresist pattern(not shown in the drawing) is formed by exposure and development of the photoresist using a mask for defining a gate electrode. A final gate electrode 226 and 227 comprised of a remaining silicide layer 226 and a remaining doped polysilicon layer 227 is formed by removing the silicide layer and the polysilicon layer which are not covered with the photoresist pattern. In this case, the final gate electrode 226 and 227 is formed by carrying out dry etching on the silicide layer and the doped silicon layer using the photoresist pattern as a mask. Then, the photoresist pattern is removed by $O_2$ ashing.

Although not shown in the drawing, semiconductor devices such as transistors and the like are completed by forming a lightly doped drain(hereinafter abbreviated LDD) region in a predetermined portion of the substrate near the final gate 226 and 227, by forming a gate sidewall spacer and by forming a source and a drain and the like.

Figure 3A:
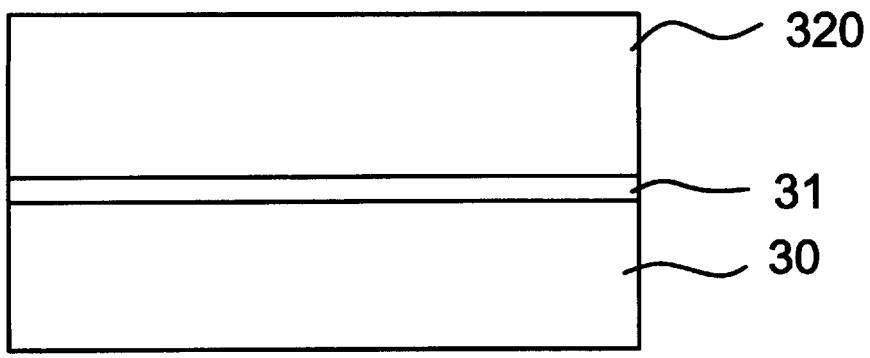
FIGS. 3A to 3E show cross-sectional views of a method of forming polycide in a semiconductor device according to a second embodiment of the present invention.

FIGS. 3A to 3E show cross-sectional views of a method for forming polycide in a semiconductor device according to a second embodiment of the present invention. Referring to FIG. 3A, an active region and a device-insulation region are defined by forming a field oxide layer in a predetermined portion of the silicon substrate 30 by LOCOS(Local Oxidation of Silicon) or the like. A gate oxide layer 31 as a gate insulating layer is formed by carrying out thermal oxidation on the surface of the silicon substrate 30. An undoped polysilicon layer 320, to form a gate electrode, is deposited on the gate oxide layer 31 by CVD. In this case, considering the total height of the gate electrode to be formed, the polysilicon layer 320 is formed to the thickness which includes the thickness of the silicide layer to be formed. Namely, when a silicide layer of $CoSi_2$ is to be formed, an undoped polysilicon layer 320 about 2000 Å thick is formed to make a silicide layer about 1000 Å thick and a doped polysilicon layer about 1000 Å thick.

Figure 3B:
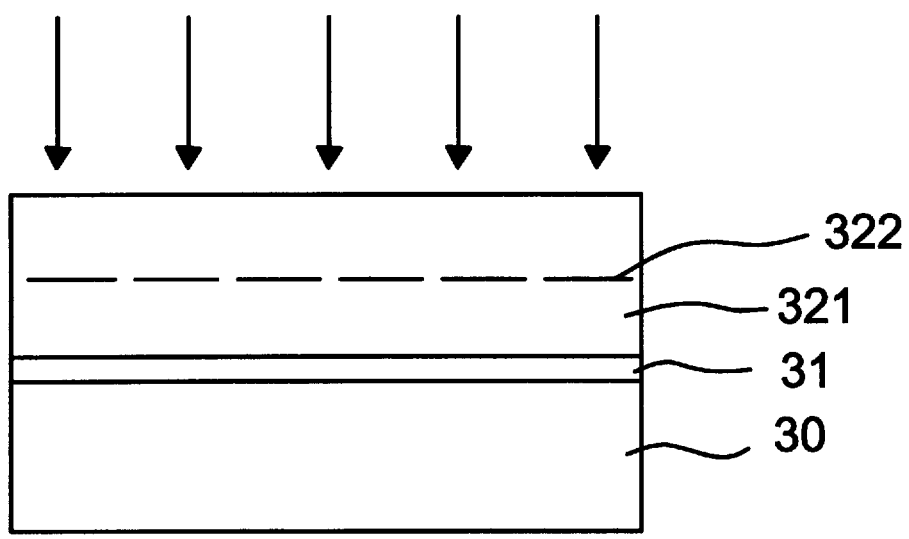

Referring to FIG. 3B, the undoped polysilicon layer 320 becomes a doped polysilicon layer 321 as an impurity-ion buried layer 322 is formed inside the polysilicon layer 321 by doping the polysilicon layer 321 with impurity ions by ion implantation to make the layer 321 electrically conductive. In this case, the ion-implantation energy is found to have the maximum concentration of dopants of impurity ions located at an interface between a metal-ion buried layer yet to be formed and the polysilicon layer 321. For instance, ion-implantation energy is about 10 KeV when boron ions are used as dopants. In this case, the silicon layer is still in the polycrystalline phase after the impurity ion-implantation. However, the silicon layer becomes amorphous by a subsequent metal ion-implantation so as to prevent the penetration of boron ions into the gate oxide layer and the channel region of the substrate.

Figure 3C:
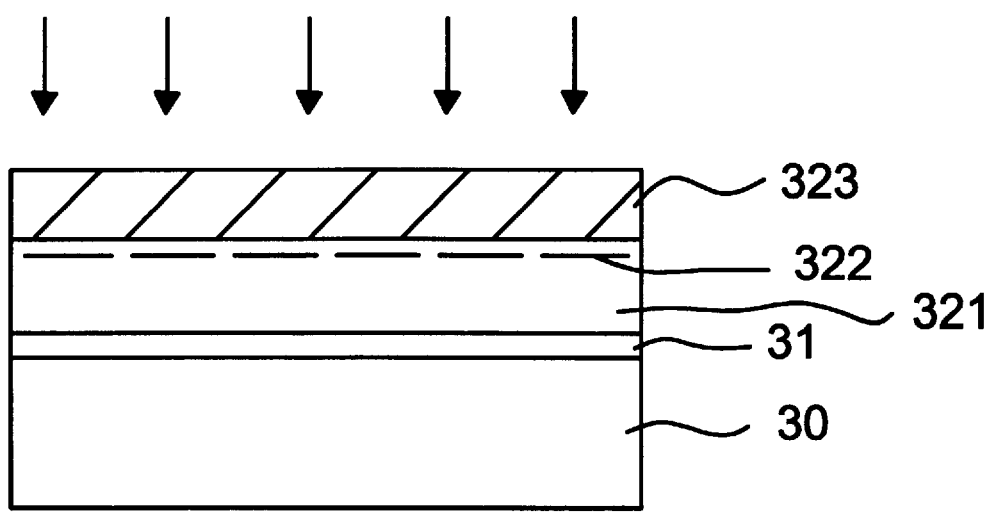

Referring to FIG. 3C, a metal-ion buried layer 323 is formed by carrying out ion-implantation onto the polysilicon layer 321 with metal ions for the silicide. The metal ions in the metal-ion buried layer 323 react with silicon atoms in the polysilicon layer 321 during a subsequent thermal treatment. Thus, the silicide is formed at the upper part of the polysilicon layer by adjusting the depth of the buried layer. In this case, when the ion-implantation is carried out with metal ions of Co or Ti, the silicide is formed by reacting 1 volume of Co or Ti with 3.6 or 2.2 volumes of Si, respectively. Accordingly, provided that the thickness of the silicide layer is 1000 Å, the depth of the buried layer from the surface of the polysilicon layer is chosen to be about 300 Å by adjusting ion-implantation energy. W, Mo, Ta and Pt ions may also be used to form the buried layer.

A one time ion-implantation is carried out not with ions of specific electric charges but with metal ions of various electric charges, and various depths of the buried layer 323 are attained by a single ion-implantation. Namely, a one time ion-implantation is carried out with $Co^+$, $Co^{2+}$, $Co^{3+}$ and the like, each corresponding depth of a buried layer is different from the others. Instead of carrying out ion-implantation one time, a series of metal-ion buried layers are formed by carrying out multiple ion-implaritations and by varying ion-implantation energy. For instance, a series of Co buried layers are formed to the depth of about 300 Å from an upper surface of the polysilicon layer by ion-implantation energies of 10, 20 and 30 KeV and doses of 1E17 to 5E17 ions/cm². After the ion-implantation has been completed, a phase change occurs wherein the polysilicon layer 321 turns into an amorphous silicon layer. Thus, grain boundaries, which are paths of ion-diffusion, of the polysilicon layer disappear. Accordingly, when the polysilicon layer is doped with boron ions, boron ions are unable to penetrate into the gate oxide layer and the active region(i.e., the channel region) of the substrate.

Figure 3D:
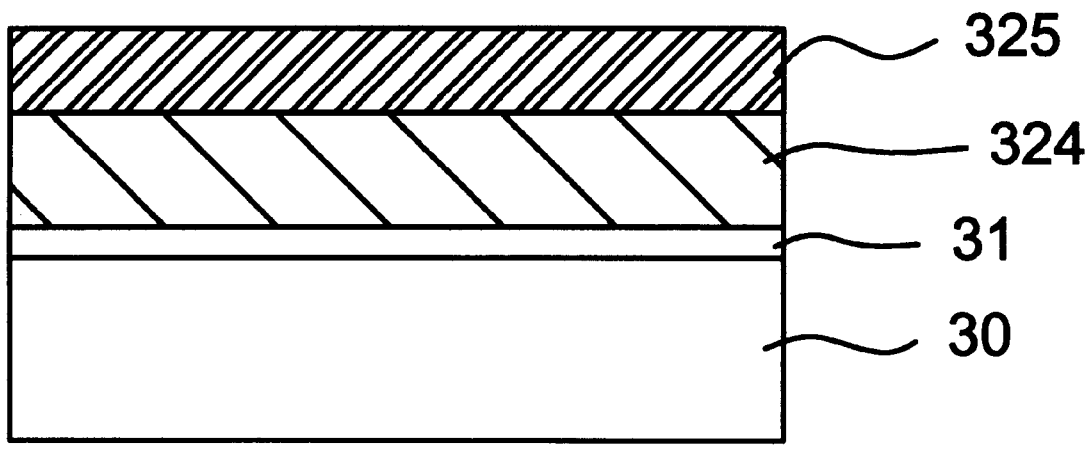

Referring to FIG. 3D, a silicide layer 325 is formed by reacting metal ions in the metal-ion buried layer with silicon in the silicon layer as soon as a conductive silicon layer 324 is formed by diffusing the dopants in the impurity-ion buried layer to make the amorphous silicon layer conductive. The conductive silicon layer becomes a lower part of a gate electrode. The conductive silicon layer 324 may be changed into the polycrystalline structure from the amorphous structure in accordance with the formation temperature. In this case, the silicide layer 325 and the conductive layer 324 are formed by a thermal treatment at 800 to 900° C. for about 30 seconds.

Figure 3E:
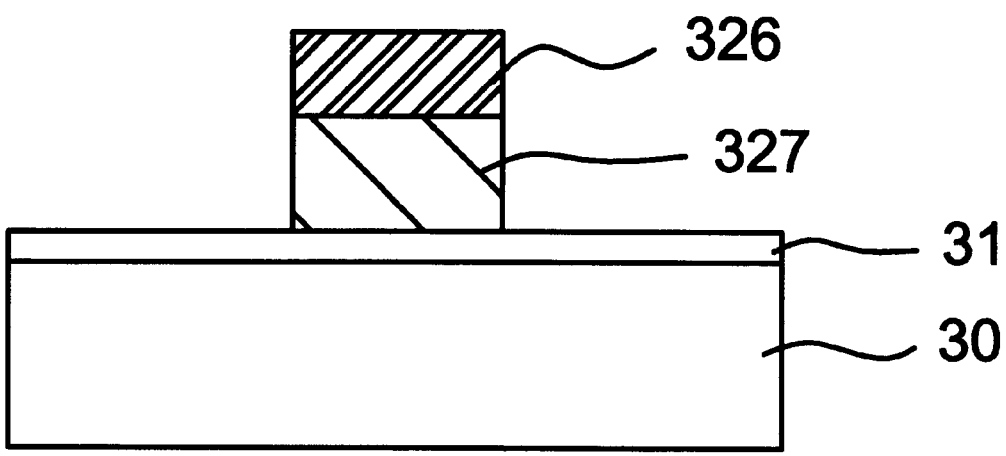

Referring to FIG. 3E, after the silicide layer has been coated with photoresist, a photoresist pattern(not shown in the drawing) is formed by exposure and development of the photoresist using a mask for defining a gate electrode. A final gate electrode 326 and 327 comprised of a remaining silicide layer 326 and a remaining doped polysilicon layer 327 is formed by removing the silicide layer and the polysilicon layer which are not covered with the photoresist pattern. In this case, the final gate electrode 326 and 327 of the polycide structure is formed by carrying out dry etching on the silicide layer and the doped silicon layer using the photoresist pattern as a mask. Then, the photoresist pattern is removed by $O_2$ ashing.

Though not shown in the drawing, semiconductor devices such as transistors and the like are completed by forming a lightly doped drain(hereinafter abbreviated LDD) region in a predetermined portion of the substrate near the final gate 326 and 327, by forming a gate sidewall spacer and by forming a source and a drain and the like.

Accordingly, the present invention improves the morphology of the interface between the silicide and the polysilicon by forming a smooth interface structure, preventing particles generated from sputtering and providing an easy method of fabricating a PMOS device of a polycide constitution by preventing the dopants from penetrating into the substrate.

It will be apparent to those skilled in the art that various modifications and variations can be made to the a method of forming polycide according to the present invention without departing from the spirit or scope of the invention. Thus, it is intended that the present invention cover the modifications and variations of this invention provided they fall within the scope of the appended claims and equivalents.

What is claimed is:

1. A method of forming polycide comprising the steps of:
   forming an insulating layer on a semiconductor substrate;
   forming a first semiconductor layer on said insulating layer;
   forming a metal-ion buried layer in said first semiconductor layer
   forming an impurity-ion buried layer under said metal-ion buried layer in said first semiconductor layer; and
   converting said metal-ion buried layer and said impurity-ion buried layer into a silicide layer and a second semiconductor layer, respectively.

2. The method of forming polycide according to claim 1, wherein
   said metal-ion buried layer is formed at a predetermined depth below an upper surface of said first semiconductor layer.

3. The method of forming polycide according to claim 1, wherein
   said impurity-ion buried layer makes said first semiconductor layer electrically conductive.

4. The method according to claim 1, wherein
   said converting step thermally treats said metal-ion buried layer and said impurity-ion buried layer to convert into said silicide layer and said semiconductor layer, respectively.

5. The method of forming polycide according to claim 1, wherein
   said forming a metal-ion buried layer step includes a first ion-implantation of a refractory metal chosen from the group comprising Ti, W, Mo, Co, Ta and Pt.

6. The method of forming polycide according to claim 5, wherein
   said forming a metal-ion buried layer step includes forming a series of metal-ion buried layers by varying ion-implantation energy used for said first ion-implantation.

7. The method of forming polycide according to claim 6, wherein
   said forming a metal-ion buried layer step includes forming a series of Co buried layers to the depth of about 300 Å from an upper surface of said first semiconductor layer by first ion-implantation energies of 10, 20 and 30 KeV and a dose of between about 1E17 and 5E17 ions/cm$^2$.

8. The method of forming polycide according to claim 5, wherein
   said first ion-implantation step includes sequentially implanting metal ions,
   each of said metal ions is one selected from the group comprising Ti, W, Mo, Co, Ta and Pt, and
   said metal-ions have various electric charges.

9. The method of forming polycide according to claim 5, wherein
   said forming an impurity-ion buried layer step includes carrying out a second ion-implantation on said first semiconductor layer with dopants which make said first semiconductor layer conductive.

10. The method of forming polycide according to claim 1, wherein
    said forming an impurity-ion buried layer step includes implanting a maximum concentration of ions in said impurity-ion buried layer at an interface between said metal-ion buried layer and said first semiconductor layer.

11. The method of forming polycide according to claim 1, wherein
    said forming an impurity-ion buried layer step implants boron ions under said metal-ion buried layer in said first semiconductor layer.

12. The method of forming polycide according to claim 1, wherein
    said converting of said metal-ion buried layer and said impurity-ion buried layer into said silicide layer and said second semiconductor layer step includes a thermal treatment at 800 to 900° C. for about 30 seconds.

13. The method of forming polycide according to claim 1, the method further comprising:
    forming a gate electrode by removing predetermined portions of said silicide layer and said second semiconductor layer.

14. A method of forming polycide comprising the steps of:
    forming an insulating layer on a semiconductor substrate;
    forming a first semiconductor layer on said insulating layer;
    forming an impurity-ion buried layer in said first semiconductor layer;
    forming a metal-ion buried layer in a predetermined portion of the first semiconductor layer over said impurity-ion buried layer; and
    converting said metal-ion buried layer and said impurity-ion buried layer into a silicide layer and a second semiconductor layer, respectively.

15. The method of forming polycide according to claim 14, wherein
    said metal-ion buried layer is formed at a predetermined depth below an upper surface of said first semiconductor layer.

16. The method of forming polycide according to claim 14, wherein
    said impurity-ion buried layer makes said first semiconductor layer electrically conductive.
17. The method according to claim 14, wherein
    said converting step thermally treats said metal-ion buried layer and said impurity-ion buried layer to convert into said silicide layer and said semiconductor layer, respectively.
18. The method of forming polycide according to claim 14, wherein
    said forming an impurity-ion buried layer step includes carrying out a first ion-implantation on said first semiconductor layer with dopants which make said first semiconductor layer conductive.
19. The method of forming polycide according to claim 18, wherein
    said forming a metal-ion buried layer step includes a second ion-implantation with a refractory metal chosen from the group comprising Ti, W, Mo, Co, Ta and Pt.
20. The method of forming polycide according to claim 19, wherein
    said second ion-implantation step includes sequentially implanting metal ions, from the group comprising Ti, W, Mo, Co, Ta and Pt, and
    said ions have various electric charges.
21. The method of forming polycide according to claim 19, wherein
    said forming a metal ion buried layer step includes forming a series of metal-ion buried layers by varying ion-implantation energy.
22. The method of forming polycide according to claim 21, wherein
    said forming a metal-ion buried layer step includes forming a series of Co buried layers to the depth of about 300 Å from an upper surface of said first semiconductor layer by said second ion-implantation energies of 10, 20 and 30 KeV and a dose of 1E17 to 5E17 ions/cm$^2$.
23. The method of forming polycide according to claim 14, wherein
    said impurity-ion buried layer formation step includes implanting a maximum concentration of ions in said impurity-ion buried layer at an interface between said metal-ion buried layer and said first semiconductor layer.
24. The method of forming polycide according to claim 14, wherein
    said forming an impurity-ion buried layer step implants boron ions under said metal-ions under said metal-ion buried layer in said first semiconductor layer.
25. The method of forming polycide according to claim 14, wherein
    said converting of said metal-ion buried layer and said impuritiy-ion buried layer into said silicide layer and said second semiconductor layer includes a thermal treatment at 800 to 900° C. for about 30 seconds.
26. The method of forming polycide according to claim 14, the method further comprising:
    forming a gate electrode by removing predetermined portions of said silicide layer and said second semiconductor layer.

* * * * *